(12) United States Patent
Xie et al.

(10) Patent No.: US 9,523,734 B2
(45) Date of Patent: Dec. 20, 2016

(54) TEST APPARATUS AND MOVABLE TEST CHAMBER THEREOF

(71) Applicant: DELTA ELECTRONICS, INC., Taoyuan Hsien (TW)

(72) Inventors: Chao Xie, Taoyuan Hsien (TW); Chi-Lung Hsiao, Taoyuan Hsien (TW); Tzu-Chiang Chou, Taoyuan Hsien (TW); Ming Xia, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 959 days.

(21) Appl. No.: 13/671,787

(22) Filed: Nov. 8, 2012

(65) Prior Publication Data

US 2014/0049277 A1 Feb. 20, 2014

(30) Foreign Application Priority Data

Aug. 20, 2012 (CN) .......................... 2012 1 0297922

(51) Int. Cl.
*G01R 31/00* (2006.01)
*G01R 31/28* (2006.01)

(52) U.S. Cl.
CPC ....... *G01R 31/2862* (2013.01); *G01R 31/2867* (2013.01)

(58) Field of Classification Search
CPC ... G01R 31/2862; G01R 31/2867; G01R 1/00; G01R 1/02; G01R 1/04; G01R 1/048; G01R 1/0433; G01R 1/045; G01R 1/0483; G01R 1/0491; G01R 1/06; G01R 1/10; G01R 1/12; G01R 31/00; G01R 31/002; G01R 31/003; G01R 31/01; G01R 31/02;G01R 31/021; G01R 31/022; G01R 31/024; G01R 31/025; G01R 31/04; G01R 31/06; G01R 31/26; G01R 31/2648; G01R 31/1265; G01R 31/127; G01R 31/2801; G01R 31/1282; G01R 31/2855; G01R 31/286; G01R 31/2863; G01R 31/2865; G01R 31/2868; G01R 31/2875; G01R 31/2879; G01R 31/2881; G01R 31/2887; G01R 31/2893; G01R 31/2896; G01R 31/302

See application file for complete search history.

(56) References Cited

U.S. PATENT DOCUMENTS 3,478,382 A * 11/1969 Nosenzo ................. B60B 33/08
16/24
5,379,823 A * 1/1995 Kraeutler .............. E06B 9/0669
160/271

(Continued)

FOREIGN PATENT DOCUMENTS

CN 1808157 7/2006
CN 101769985 7/2010

(Continued)

*Primary Examiner* — Lisa Caputo
*Assistant Examiner* — Janice M Soto
(74) *Attorney, Agent, or Firm* — Hauptman Ham, LLP (57) ABSTRACT

A test apparatus includes a plurality of rails, a plurality of test zones and a movable test chamber. The test zones are located between the rails. The movable test chamber includes a passageway, at least one heat source and at least one pair of rolling balls. The heat source is used to heat the passageway. The pair of rolling balls is movably contained in two rails, so as to facilitate movement of the passageway to different test zones.

14 Claims, 5 Drawing Sheets

(56) References Cited

U.S. PATENT DOCUMENTS

| | | | | |
|---|---|---|---|---|
| 6,607,071 B1* | 8/2003 | An | ................. | G01R 31/2862 198/774.2 |
| 2012/0103967 A1* | 5/2012 | Hsu | ................. | G01R 31/2862 219/400 |
| 2013/0195587 A1* | 8/2013 | Hosaka | ............. | H01L 21/6773 414/222.13 |

FOREIGN PATENT DOCUMENTS

| | | |
|---|---|---|
| CN | 201903484 | 7/2011 |
| JP | 5-113382 | 5/1993 |
| JP | 5-64750 | 8/1993 |
| JP | 5-239976 | 9/1993 |
| JP | 2002372764 | 12/2002 |
| JP | 2011247784 | 12/2011 |

\* cited by examiner

TEST APPARATUS AND MOVABLE TEST CHAMBER THEREOF

RELATED APPLICATIONS

This application claims priority to China Application Serial Number 201210297922.4, filed Aug. 20, 2012, which is herein incorporated by reference.

BACKGROUND

Technical Field

Embodiments of the present invention relate to a test apparatus. More particularly, embodiments of the present invention relate to a test apparatus for a burn-in test and a movable test chamber thereof.

Description of Related Art

In order to ensure reliability of electrical products, a burn-in test is required to be performed. When an electrical product undergoes a burn-in test at room temperature, more time is required to ensure reliability. For example, when a frequency converter undergoes a burn-in test at room temperature, 48 hours are necessary to accomplish the test, and such a long testing time results in increased costs and a high use of electricity. However, if the test time is reduced, reliability cannot be ensured.

To overcome this dilemma, a high-temperature test chamber has been developed. Such a high-temperature test chamber can be maintained at a high temperature, and allows an electrical product to undergo a burn-in test while in a high temperature environment. As a result, the test time can be reduced.

Typically, several products undergo a burn-in test simultaneously. In such a case, several high temperature test chambers are required. For example, if six frequency converters are to undergo a burn-in test simultaneously, six high temperature chambers are required. A serious cost burden is associated with requiring a separate test chamber for each product.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment of the present invention, a test apparatus includes a plurality of rails, a plurality of test zones and a movable test chamber. The test zones are located between the rails. The movable test chamber includes a passageway, at least one heat source and at least one pair of rolling balls. The heat source is used for heating the passageway. The rolling balls are respectively and movably contained in two of the rails, so as to facilitate movement of the passageway to different test zones.

In accordance with another embodiment of the present invention, a movable test chamber includes a pair of walls, a passageway and a pair of heat insulation curtains, at least one heat source and at least one pair of rolling balls. The walls encompass the passageway. The heat insulation curtains are retractable, and are used for covering opposite ends of the passageway. The heat insulation curtains and the walls form a test space. The heat source is used for heating the test space. The rolling balls are respectively positioned on the bottom surfaces of the walls.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
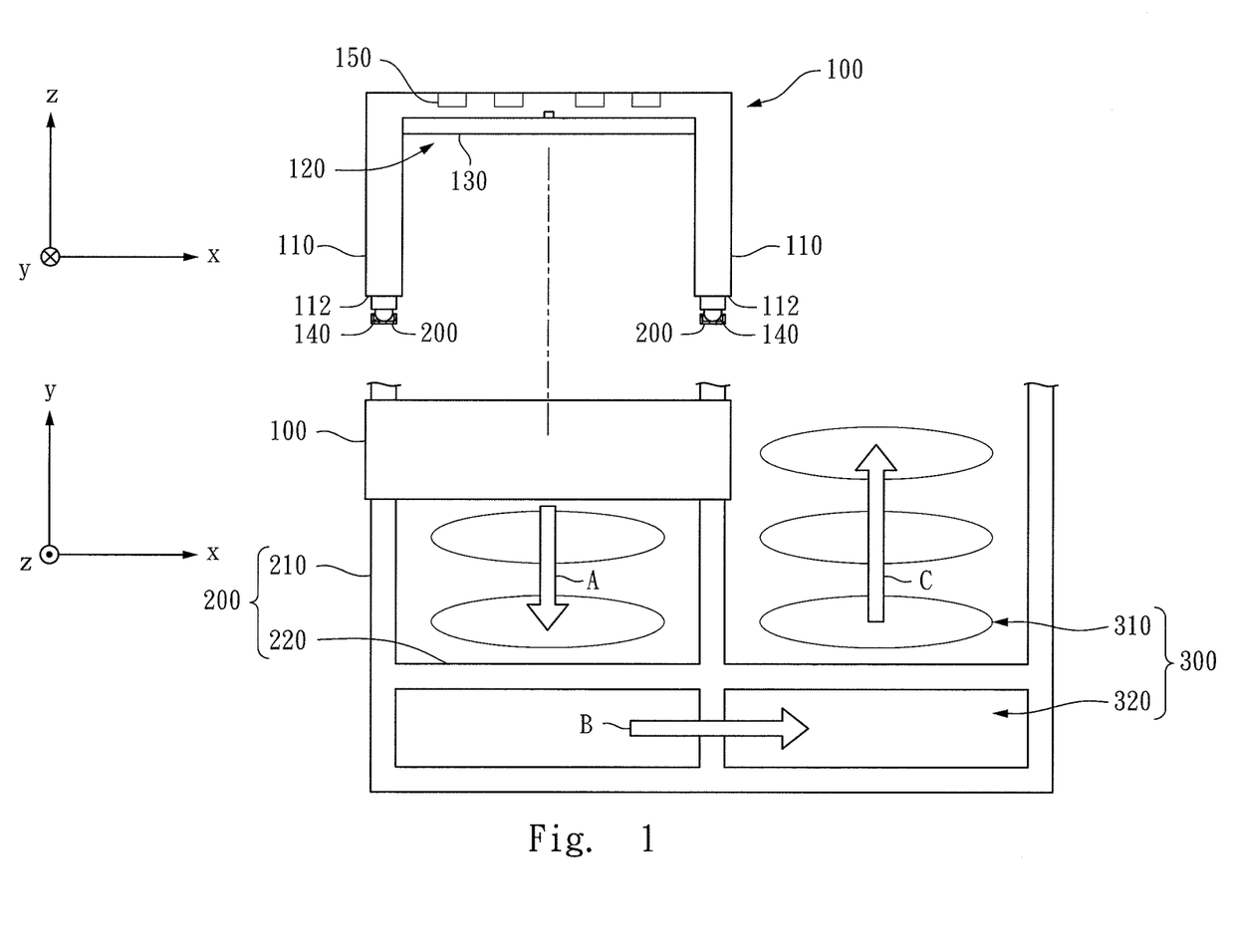
FIG. 1 is a schematic view of a test apparatus in accordance with one embodiment of the present invention.

FIG. 1 is a schematic view of a test apparatus in accordance with one embodiment of the present invention. As shown in this figure, the test apparatus includes a plurality of rails 200, a plurality of test zones 300 and a movable test chamber 100. The test zones 300 are located between the rails 200. The movable test chamber 100 includes a passageway 120, at least one heat source 150 and at least one pair of rolling balls 140. The heat source 150 is used for heating the passageway 120. The rolling balls 140 are respectively and movably contained in two of the rails 200, so as to allow the passageway 120 to be moved to different test zones 300.

In this embodiment, the rolling balls 140 can be positioned under the movable test chamber 100 and can roll in the rails 200. Because the movable test chamber 100 includes the passageway 120, even if there are many objects to be tested respectively placed on the test zones 300, the movable test chamber 100 can still move to each test zone 300 without being blocked by the objects and heat the objects using the heat source 150 to raise the temperature during a burn-in test. Therefore, in the embodiment of the present invention, only one movable test chamber 100 is required to perform a burn-in test for several objects to be tested, such as a cabinet of a frequency converter. Therefore, the cost burden associated with having to use a plurality of test chambers can be reduced.

In some embodiments, the movable test chamber 100 includes a pair of walls 110. The walls 110 encompass the passageway 120. In some embodiments, the rolling balls 140 are respectively positioned on the bottom surfaces 112 of the walls 110. Specifically, the bottom surface 112 of each wall 110 faces one of the rails 200, and the rolling ball 140 is positioned between the bottom surface 112 of the wall 110 and the rail 200. Therefore, the rolling ball 140 supports the wall 110 and is movably contained in the rail 200. When the rolling balls 140 move or roll in the rails 200, the walls 100 move, and as a result, the movable test chamber 100 moves.

In some embodiments, the movable test chamber 100 further includes a pair of heat insulation curtains 130. The heat insulation curtains 130 are retractable, and are used for covering opposite ends of the passageway 120. It is noted that by "retractably" it is meant that the heat insulation curtains 130 can be retracted by, for example, being rolled up from a state covering the opposite ends of the passageway 120 to thereby expose the opposite ends of the passageway 120. As shown in FIG. 1, the walls 110 are respectively positioned on the left side and the right side of the passageway 120, namely, opposite sides along an x-direction, and the heat insulation curtains 130 are respectively placed on the front end and the rear end of the passageway 120, namely, opposite ends along a y-direction. When covering the passageway 120, the heat insulation curtains 130 can prevent the thermal energy in the passageway 120 from dissipating to the environment, so that the heat source 150 can increase the temperature in the movable test chamber 100 more quickly, thereby facilitating the performance of a burn-in test for objects such as a cabinet of a frequency converter.

Further, because the heat insulation curtains 130 are retractable, and are used for covering opposite ends of the passageway 120, as described above, the heat insulation curtains 130 can be rolled up whenever it is desired to move the movable test chamber 100. In some embodiments, the heat insulation curtains 130 can be formed by heat insulation material. Moreover, the heat insulation curtains 130 can be rolled up or unfolded by manual control or by power driving.

In some embodiments, the rails 200 include a plurality of longitudinal rails 210. The test zones 300 include a plurality of regions 310 for objects to be tested. The regions 310 for objects to be tested are arranged between the longitudinal rails 210 along the length direction of the longitudinal rails 210. As shown in FIG. 1, the length direction of the longitudinal rails 210 is parallel to the y-direction, and the regions 310 for objects to be tested are arranged between two longitudinal rails 210 along the y-direction. Two longitudinal rails 210 encompass opposite sides of the region 310 for objects to be tested.

In some embodiments, a normal line of the passageway 120 is substantially parallel to the length direction of the longitudinal rails 210. Specifically, the normal line of the passageway 120 is parallel to the y-direction, and the length direction of the longitudinal rails 210 is also parallel to the y-direction. It should be understood that the normal line of the passageway 120 refers to an imaginary line that passes through the front end and the rear end of the passageway 120.

When the rolling balls 140 of the movable test chamber 100 roll in the longitudinal rails 210, the passageway 120 moves along the y-direction, and therefore, the movable test chamber 100 can be moved to any region 310 for objects to be tested, thereby facilitating a burn-in test for objects such as a cabinet of a frequency converter.

In some embodiments, the rails include a plurality of latitudinal rails 220. The latitudinal rails 220 cross the longitudinal rails 210. The test zones 300 include a plurality of buffering regions 320. Each of the buffering regions 320 is encompassed by two of the longitudinal rails 210 and two of the latitudinal rails 220. As shown in FIG. 1, the length direction of the latitudinal rails 220 is parallel to the x-direction. Two longitudinal rails 210, which are parallel to the y-direction, and two latitudinal rails 220, which are parallel to the x-direction, encompass a buffering region 320. In other words, two latitudinal rails 220 respectively encompass the upper side and the lower side of one of the buffering regions 320, and two longitudinal rails 210 respectively encompass the left side and the right side of the buffering region 320.

The main difference between the buffering regions 320 and the regions 310 for objects to be tested is that no object, such as a cabinet of a frequency converter, is placed in the buffering regions 320. Therefore, even though the walls 110 are formed on opposite sides of the movable test chamber 100 in the x-direction, the movable test chamber 100 can move latitudinally (i.e., in the x-direction) via the buffering regions 320.

Specifically, the rolling balls 140 can move in the latitudinal rails 220 in addition to moving in the longitudinal rails 210. Therefore, for example, the movable test chamber 100 can be moved from the region 310 on the left side to the buffering region 320 on the left side along the direction of arrow A in FIG. 1, then can be moved from the buffering region 320 on the left side to the buffering region 320 on the right side along the direction of arrow B in FIG. 1. After being moved to the buffering region 320 on the right side, the movable test chamber 100 can be moved upwardly to the region 310 for objects to be tested on the right side along the direction of arrow C. In other words, the buffering region 320 allows the movable test chamber 100 to be moved along the x-direction, so that the movable test chamber 100 is not limited to moving only along the y-direction. Therefore, the movable test chamber 100 can be moved to the regions 310 for objects to be tested that are between different longitudinal rails 210, rather than being limited to move between a particular pair of the longitudinal rails 210 associated with one particular region 310.

Figure 2:
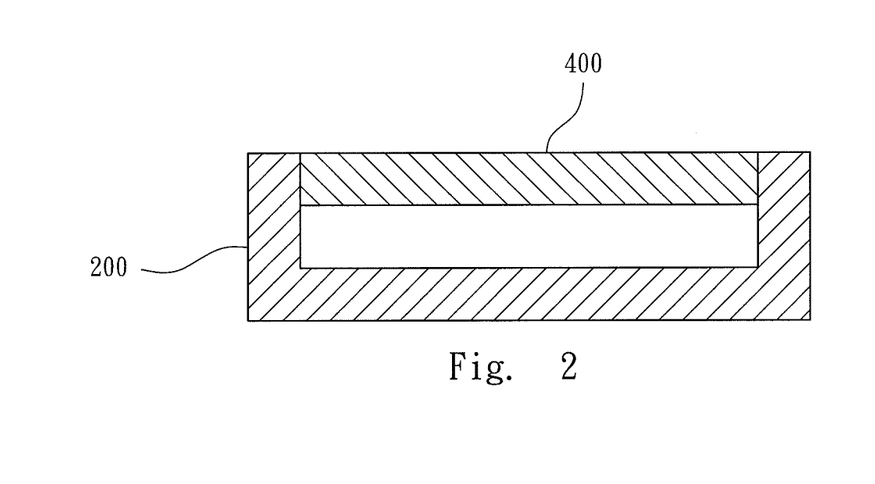
FIG. 2 is a cross-sectional view of a rail in accordance with one embodiment of the present invention.

FIG. 2 is a cross-sectional view of one of the rails 200 in accordance with one embodiment of the present invention. As shown in FIG. 2, a plurality of covers 400 can be included to cover some rails 200. Specifically, when the movable test chamber 100 is not moving, the covers 400 cover the rails 200, so as to prevent dust from falling into the rails 200, and to press against the rolling balls 140 (See FIG. 1), so that the rolling balls 140 do not move freely. In some embodiments, the covers 400 tightly contact the rails 200. For example, each of the rails 200 can be a U-shaped recess, and the corresponding cover 400 can be exactly contained in this U-shaped recess.

Figure 3:
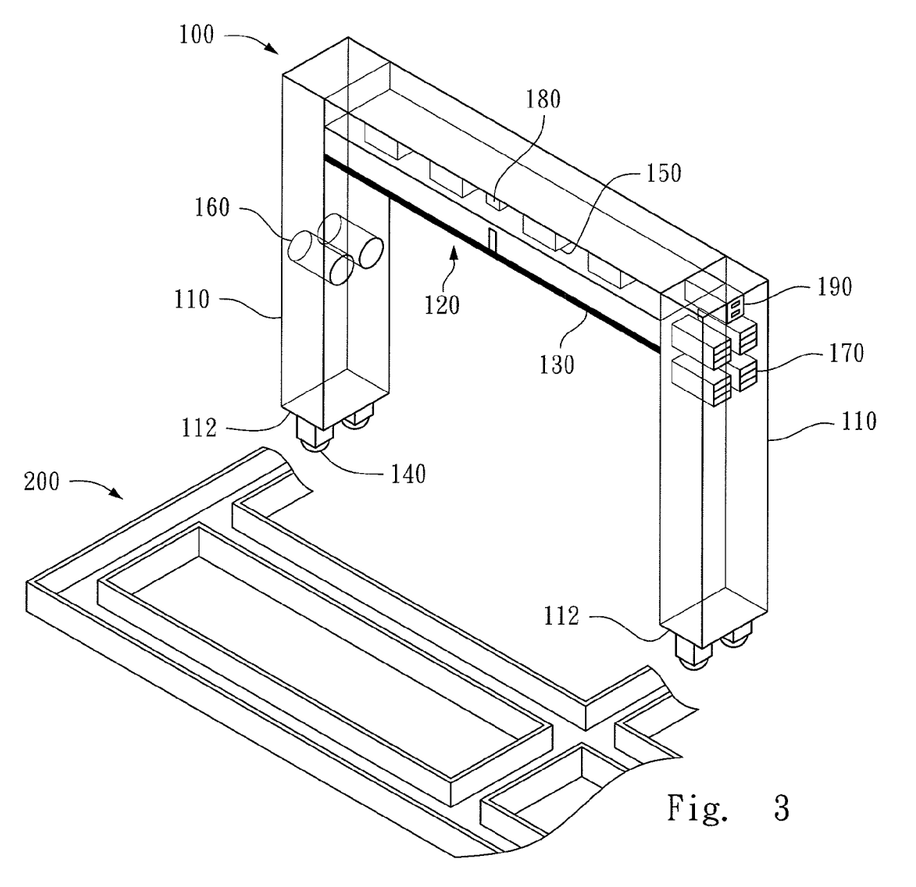
FIG. 3 is a perspective view of a movable test chamber in one operation state in accordance with one embodiment of the present invention.
Figure 4:
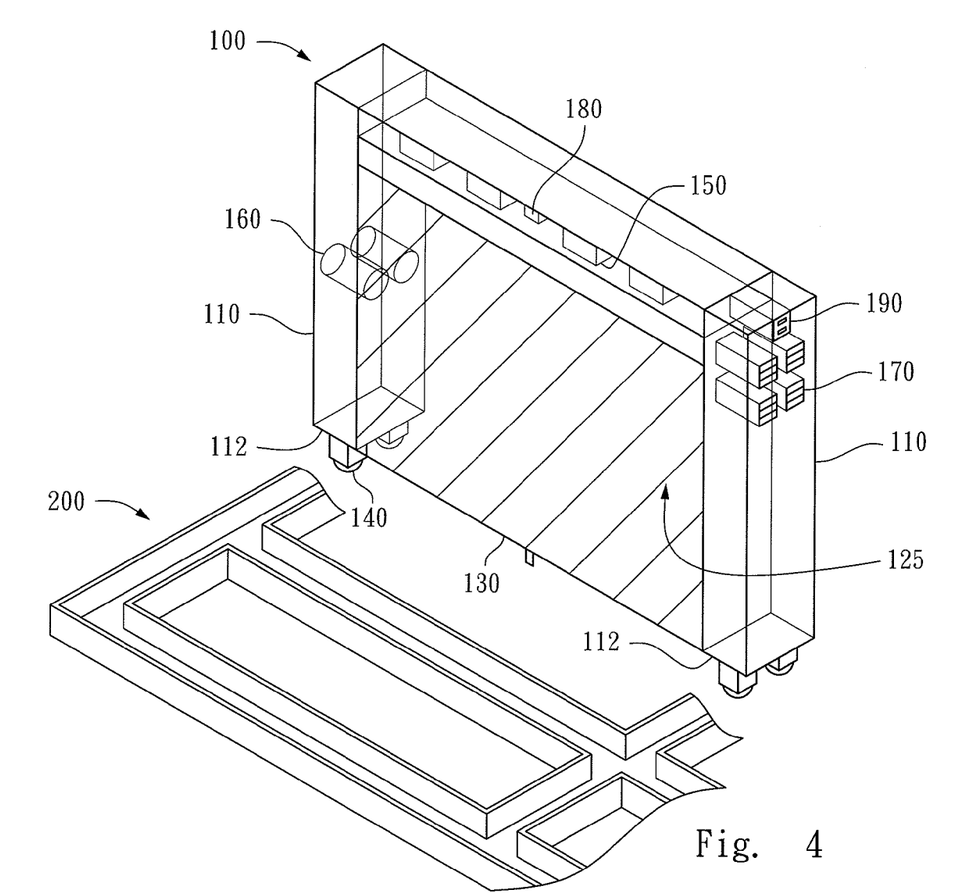
FIG. 4 is a perspective view of the movable test chamber of FIG. 3 in another operation state.

FIG. 3 is a perspective view of the movable test chamber 100 in one operation state in accordance with one embodiment of the present invention, and FIG. 4 is a perspective view of the movable test chamber 100 of FIG. 3 in another operation state. As shown in FIG. 3 and FIG. 4, the movable test chamber 100 includes a pair of walls 110, a passageway 120, a pair of heat insulation curtains 130, at least one heat source 150 and at least one pair of rolling balls 140. The walls 110 encompass the passageway 120. The heat insulation curtains 130 are retractable, and are used for covering opposite ends of the passageway 120. The heat insulation curtains 130 and the walls 110 form a test space 125. The heat source 150 is used for heating the test space 125. The rolling balls 140 are respectively positioned on the bottom surfaces 112 of the walls 110.

In this embodiment, the rolling balls 140 can be positioned under the movable test chamber 100, and the walls 110 encompass the passageway 120. The movable test chamber 100 can be moved in any direction or along a particular direction by rolling the rolling balls 140. When the heat insulation curtain 130 is rolled up (See FIG. 3), the passageway 120 can be moved to a particular position where the object to be tested can be contained in the movable test chamber 100. When performing a burn-in test, the heat insulation curtains 130 can be spread open or unfolded, and the heat insulation curtains 130 and the walls 110 form a test space 125. The heat source 150 can heat the test space 125 to increase the temperature of the test space 125 for accelerating the burn-in test.

In some embodiments, the movable test chamber 100 further includes at least one exhaust opening 160 for exhausting air from the passageway 120 to outside. Specifically, because the heat source 150 continuously provides thermal energy to the test space 125, the temperature of the test space 125 is increased continuously. However, it is preferred to maintain the temperature at a constant value such as 50° C., rather than increasing the temperature on a continuous basis when performing the burn-in test. Therefore, the exhaust opening 160 can be employed to exhaust the hot air in the test space 125, so as to slow down the speed that the temperature increases. In some embodiments, the exhaust opening 160 can be connected to an external exhaust hose (not shown), so as to accelerate the speed at which hot air is exhausted from the test space 125.

In some embodiments, the movable test chamber 100 further includes at least one intake window 170 for outside air entering into the passageway 120. In other words, cool air blows into the movable test chamber 100 through the intake window 170, so as to slow down the speed that the temperature increases.

In some embodiments, the movable test chamber 100 includes both the exhaust opening 160 and the intake window 170, so that hot air can be exhausted through the exhaust opening 160 and cool air can be blown into the movable test chamber 100 through the intake window 170. Therefore, the temperature can be maintained at a constant level. For example, the temperature of the test space 125 can be maintained at about 50° C. The exhaust opening 160 can be formed on one of the walls 110, and the intake window 170 can be formed on another one of the walls 110 at an area that is opposite to the exhaust opening 160, so that the air can flow smoothly. For example, as shown in FIG. 3 and FIG. 4, the exhaust opening 160 is formed on the wall 110 on the left side, and the intake window 170 is formed on the wall 110 on the right side.

In some embodiments, the movable test chamber 100 further includes at least one temperature sensor 180 which is used for detecting the temperature of the passageway 120. Specifically, the temperature sensor 180 can be placed in the test space 125 to detect the temperature of the test space 125, so that the user can use the detected result to determine whether the temperature in the test space 125 is normal. As shown in FIG. 3 and FIG. 4, the temperature sensor 180 can be positioned on the top of the movable test chamber 100 and between two heat sources 150.

In some embodiments, the movable test chamber 100 further includes at least one monitor 190 which is used for displaying the temperature that the temperature sensor 180 detects. Specifically, the monitor 190 can be positioned on the outer surface of one of the walls 110. Therefore, the user can be informed of the temperature of the test space 125 by simply looking at the outer surface of the wall 110 of the movable test chamber 100. As shown in FIG. 3 and FIG. 4, the monitor 190 and the intake window 170 can be formed on the same wall 110.

Figure 5:
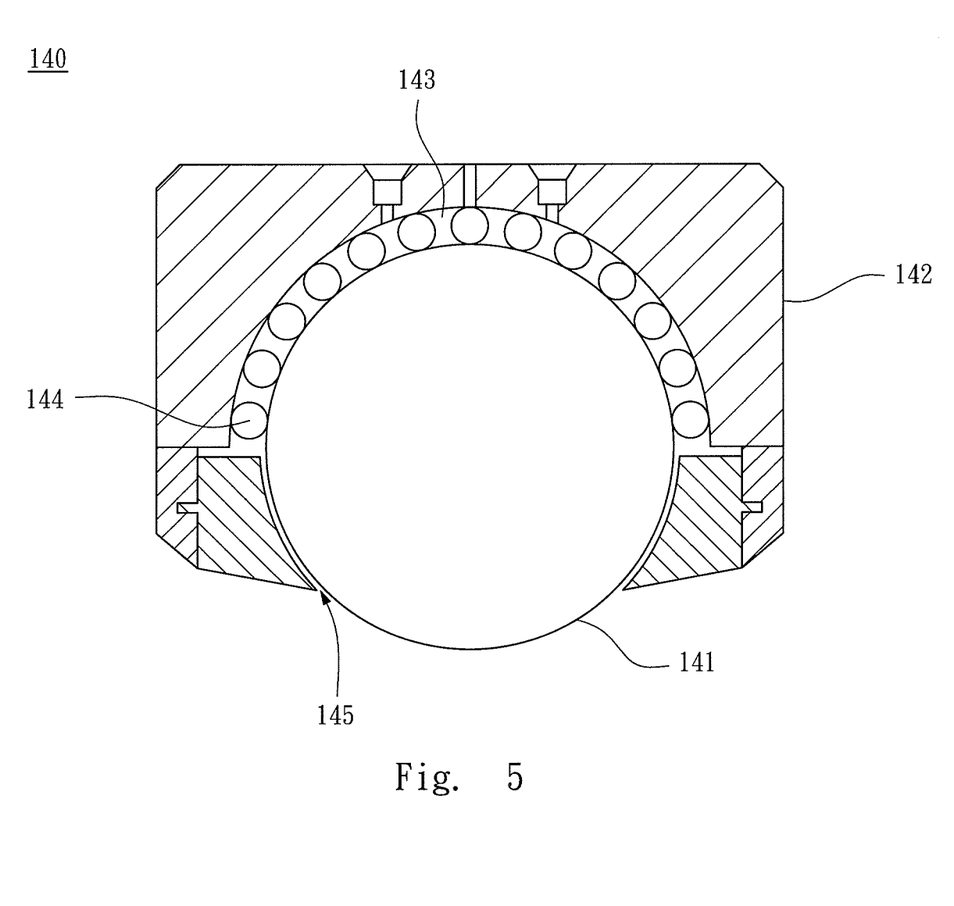
FIG. 5 is a cross-sectional view of a rolling ball in accordance with one embodiment of the present invention.

In some embodiments, the rolling ball 140 is a universal ball that can move in any direction. For example, referring to FIG. 5, which is a cross-sectional view of the rolling ball 140 in accordance with one embodiment of the present invention, the rolling ball 140 may include a first sphere 141, a sphere base 142, an arc groove 143, a plurality of second spheres 144 and a gap 145. The arc groove 143 is formed in the sphere base 142. The second spheres 144 are contained in the arc groove 143 and press against the first sphere 141. The second spheres 144 can roll freely in the arc groove 143, and the first sphere 141 can roll freely relative to the second spheres 144. Therefore, the first sphere 141 can roll in any direction, and as a result, the rolling ball 140 functions as a universal ball. Further, the gap 145 formed between the first sphere 141 and the sphere base 142 can prevent the first sphere 141 from contacting the sphere base 142 when rolling.

Referring again to FIGS. 1, 3, 4 and 5, in some embodiments, the heat sources 150 can be arranged on the top of the movable test chamber 100 at equal or unequal intervals. Each of the heat sources 150 can be a radiator that converts electric power to generate thermal energy and that radiates the thermal energy to the test space 125. In some embodiments, each of the heat sources 150 is not limited to being a radiator.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test apparatus, comprising:
a plurality of rails;
a plurality of test zones located between the rails, wherein the test zones are capable of being respectively placed with a plurality of objects to be tested; and
a movable test chamber comprising:
a passageway;
at least one heat source for heating the passageway; and
at least one pair of rolling balls respectively and movably contained in two of the rails, so as to facilitate movement of the passageway to different test zones and to enable the passageway to sequentially cover the objects to be tested.

2. The test apparatus of claim 1, wherein the movable test chamber comprises:
a pair of walls encompassing the passageway, the rolling balls respectively being positioned on bottom surfaces of the walls.

3. The test apparatus of claim 1, wherein the movable test chamber comprises:
a pair of heat insulation curtains for covering opposite ends of the passageway.

4. The test apparatus of claim 1, wherein the rails comprise:
a plurality of longitudinal rails, wherein the test zones comprise a plurality of regions for the objects to be tested, and the regions for the objects to be tested are arranged between the longitudinal rails along the length direction of the longitudinal rails, and a normal line of the passageway is substantially parallel to the length direction of the longitudinal rails, wherein the normal line of the passageway is an imaginary line that passes through a front end and a rear end of the passageway.

5. The test apparatus of claim 4, wherein the rails further comprise:
 a plurality of latitudinal rails crossing the longitudinal rails, wherein the test zones comprise a plurality of buffering regions, and each of the buffering regions is encompassed by two of the longitudinal rails and two of the latitudinal rails.

6. The test apparatus of claim 1, wherein the movable test chamber comprises:
 at least one exhaust opening for exhausting air from the passageway to outside.

7. The test apparatus of claim 1, wherein the movable test chamber comprises:
 at least one intake window for outside air entering into the passageway.

8. The test apparatus of claim 1, wherein the movable test chamber comprises:
 at least one temperature sensor for detecting the temperature of the passageway.

9. The test apparatus of claim 8, wherein the movable test chamber comprises:
 at least one monitor for displaying the temperature that the temperature sensor detects.

10. A movable test chamber, comprising:
 a pair of walls;
 a passageway encompassed by the walls and having two opposite openings;
 a pair of heat insulation curtains for covering the opposite openings of the passageway when the heat insulation curtains are unfolded and for exposing the opposite openings when the heat insulation curtains are retracted, wherein the heat insulation curtains and the walls form a test space when the heat insulation curtains are unfolded;
 at least one heat source for heating the test space; and
 at least one pair of rolling balls respectively positioned on the bottom surfaces of the walls,
 wherein at least one of the rolling balls comprises a sphere that is free to roll relative to other portion of the rolling ball.

11. The movable test chamber of claim 10, further comprising:
 at least one exhaust opening formed on one of the walls.

12. The movable test chamber of claim 11, further comprising:
 at least one intake window formed on another one of the walls that is opposite to the exhaust opening.

13. The movable test chamber of claim 10, further comprising:
 at least one temperature sensor placed in the test space and which detects the temperature in the test space.

14. The movable test chamber of claim 10, further comprising:
 at least one monitor positioned on the outer surface of one of the walls, the monitor displaying the temperature that the temperature sensor detects.

* * * * *